United States Patent [19]

Panis

[11] Patent Number: 5,689,515
[45] Date of Patent: Nov. 18, 1997

[54] HIGH SPEED SERIAL DATA PIN FOR AUTOMATIC TEST EQUIPMENT

[75] Inventor: Michael C. Panis, Brookline, Mass.

[73] Assignee: Teradyne, Inc., Boston, Mass.

[21] Appl. No.: 638,026

[22] Filed: Apr. 26, 1996

[51] Int. Cl.$^6$ .................................................. G01R 31/28
[52] U.S. Cl. .................. 371/22.1; 371/25.1; 371/27; 395/421.08
[58] Field of Search .................. 371/22.1, 25.1, 371/27, 61; 307/234, 303, 269; 395/550, 183.06, 421.08; 375/224, 225; 324/765, 73.1

[56] References Cited

PUBLICATIONS

Robert J. Wenzel and David C. Keezer, "Extension of Digital Test System Data Rates to the Gigabit Per Second Range," *Proceedings of Instrumentation and Measurement Conference*, 1993, pp. 333–336.

D.C. Keezer and R.J. Wenzel, "Calibration Techniques for a Gigahertz Test System," *Proceedings of International Test Conference*, 1992, pp. 530–537.

David C. Keezer, "Multiplexing Test System Channels for Data Rates Above 1 Gb/s," *Proceedings of International Test Conference*, 1990, pp. 362–368.

*Primary Examiner*—Robert W. Beausoliel, Jr.
*Assistant Examiner*—Nadeem Iqbal
*Attorney, Agent, or Firm*—Richard E. Gamache

[57] ABSTRACT

A tester that produces digital timing signals having fast data rates including multiple groups of timing generators, multiple "exclusive-or" gates, and an "or" gate. Each group of timing generators is connected to an exclusive-or gate, and the output of each exclusive-or gate is coupled to the or gate. The digital timing signals are encoded such that the timing generators in each group may assert timing pulses only during specified cycles within a series of clock cycles. Each combination of timing generators within a group either asserting their respective encoded timing signals, or not asserting any timing signals during the series of clock cycles, generates a unique serial data stream. The serial data streams generated by the groups of timing generators are then combined to produce a new digital timing signal having a data rate that is faster than the data rate of the encoded digital timing signals.

13 Claims, 11 Drawing Sheets

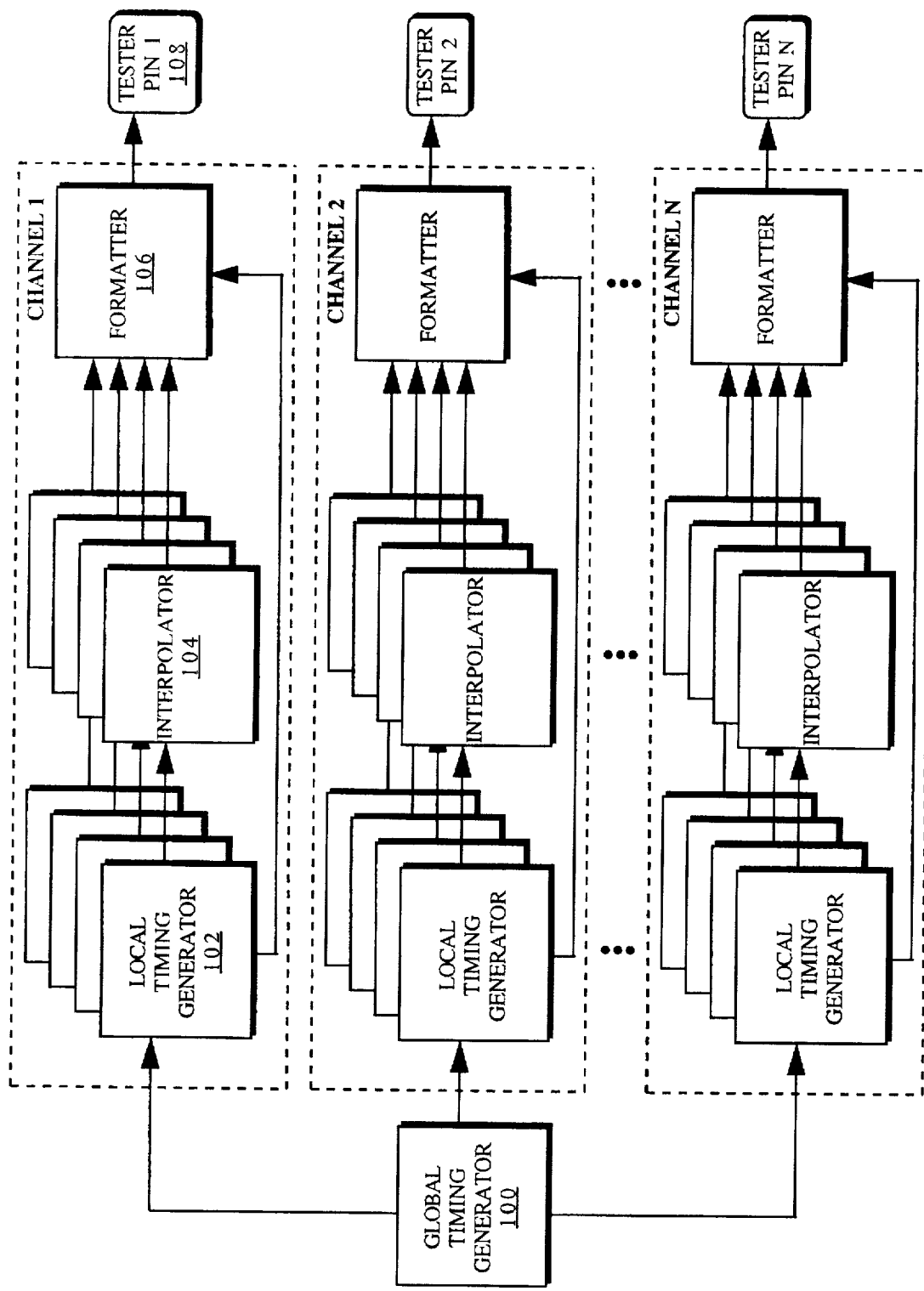
FIG. 1A - PRIOR ART

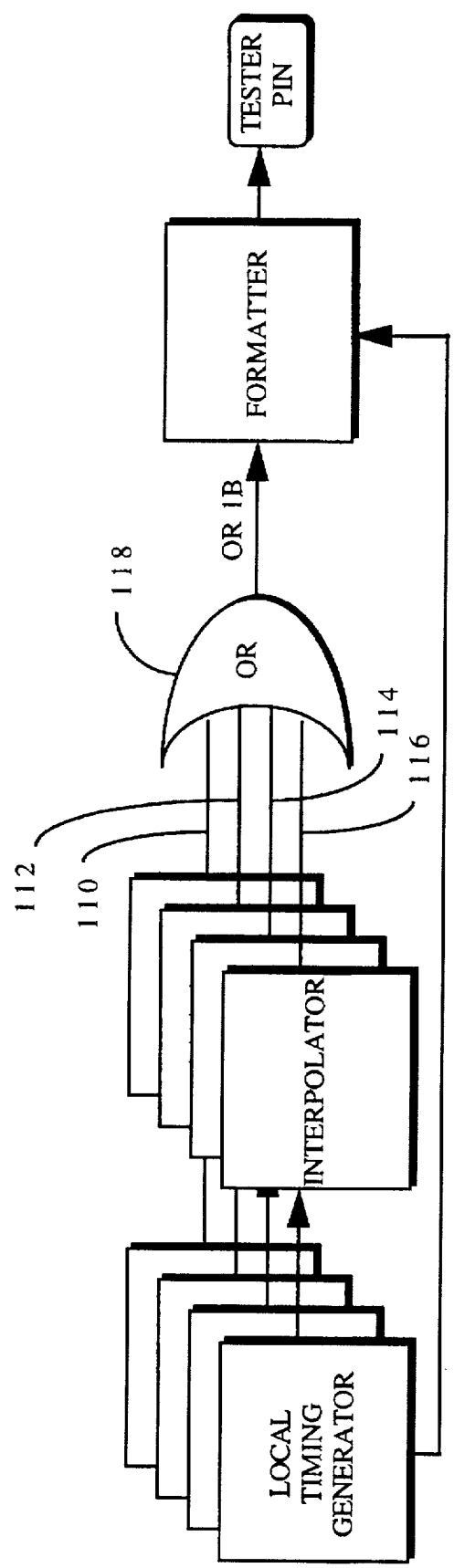
FIG. 1B - PRIOR ART

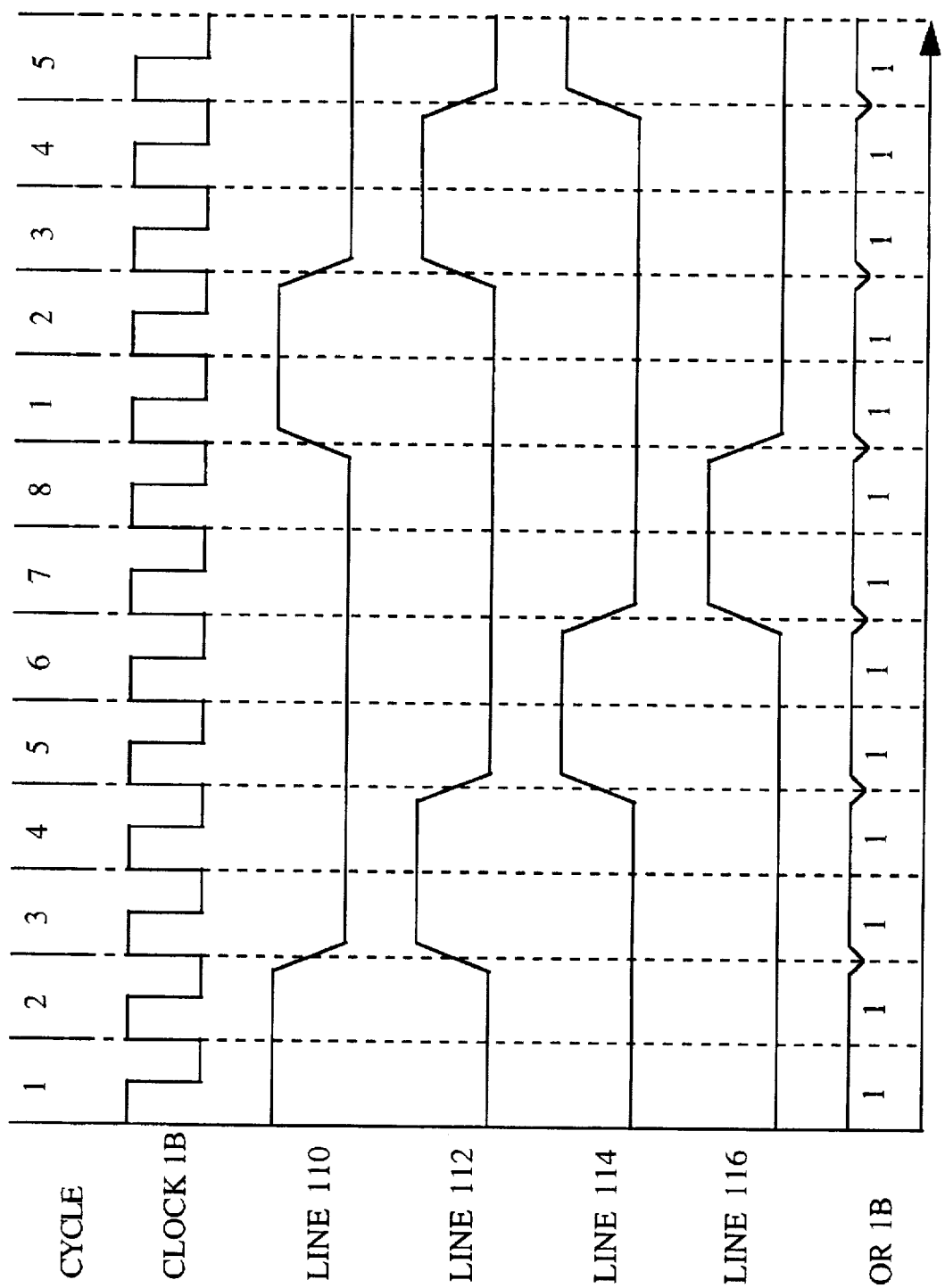
FIG. 1C - PRIOR ART

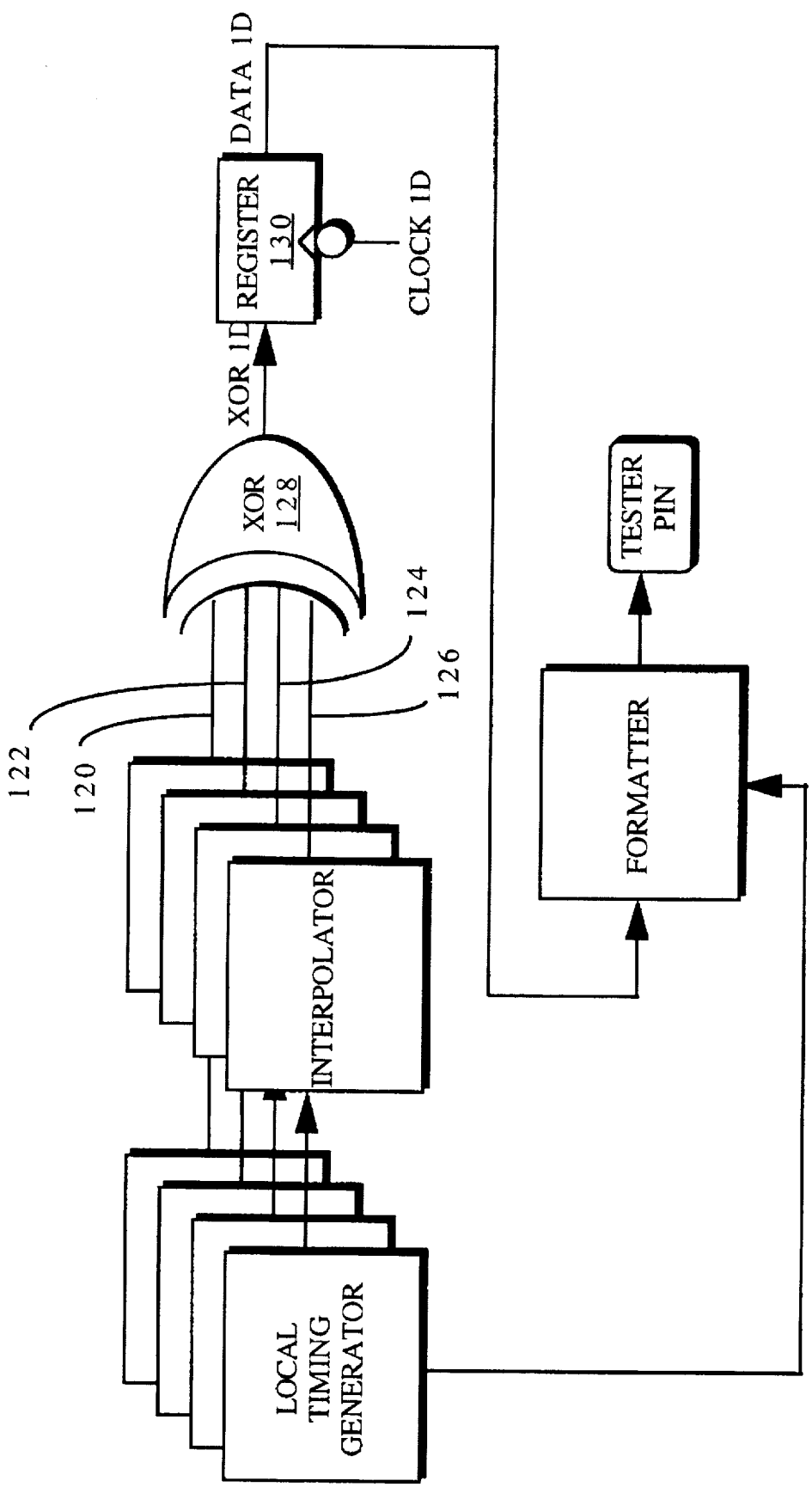
FIG. 1D - PRIOR ART

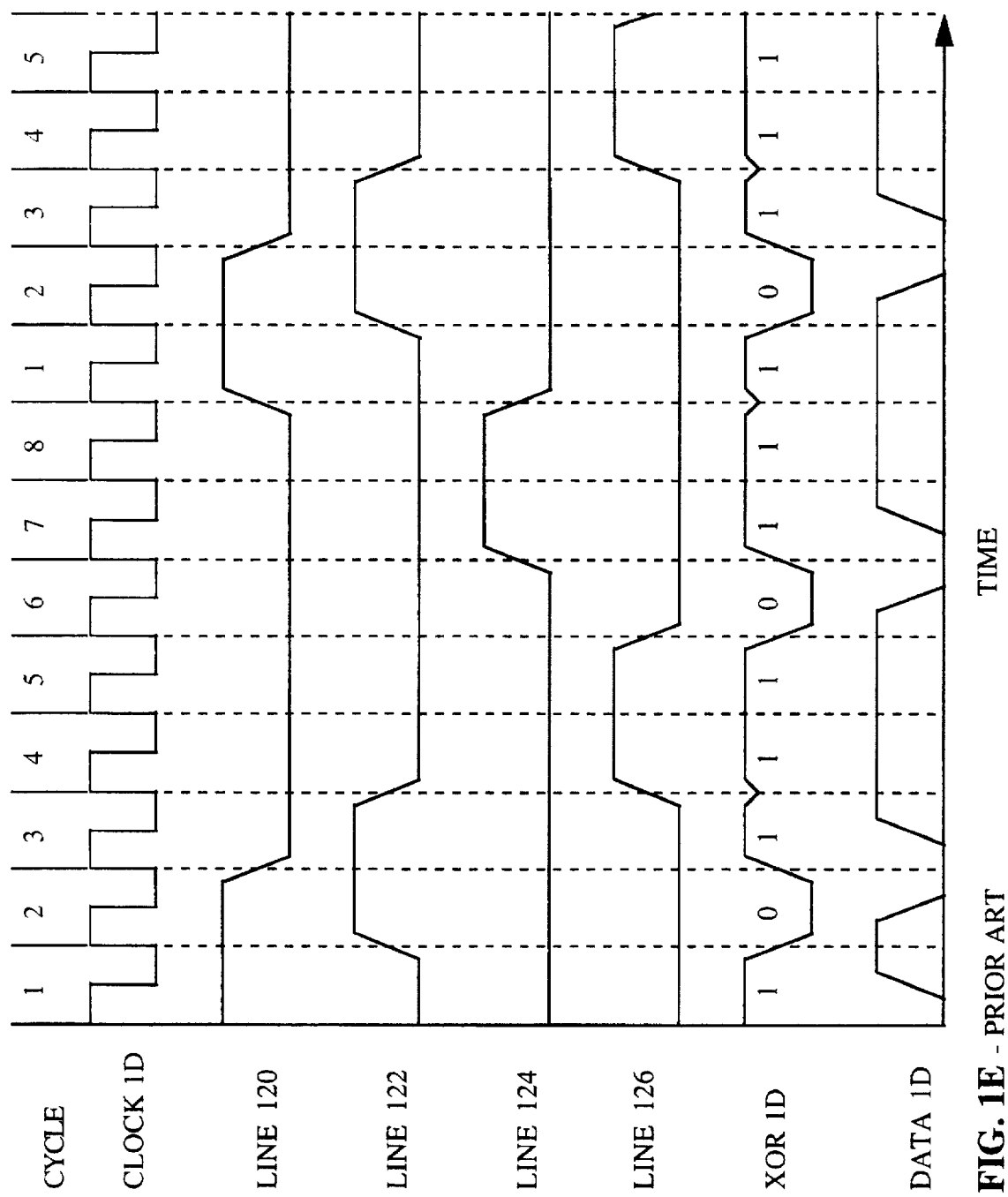
FIG. 1E - PRIOR ART

HIGH SPEED SERIAL DATA PIN FOR AUTOMATIC TEST EQUIPMENT

BACKGROUND OF THE INVENTION

This invention relates generally to automatic test equipment, and more particularly to the generation of timing signals in automatic test equipment.

Automatic test equipment, also known as "testers," are commonly used in the semiconductor industry to determine whether electronic devices contain manufacturing defects. Testers generally consist of computerized control circuitry, driver and receiver channels, and tester pins. Numerous tester pins connect the nodes of a device under test (DUT) to the driver and receiver channels of the tester.

During a typical test session, the driver channels apply test signals to the DUT, and the receiver channels detect output signals produced by the DUT in response to the test signals. Further, testers generally evaluate the output signals by comparing them with response data which would be produced by a properly functioning device.

In order to fully test an electronic device, testers generally apply test signals to the DUT, and detect output signals from the DUT, at data rates which either meet or exceed the normal operating speed of the DUT. This is because the tester may not find certain faults or error conditions unless the DUT is exercised at fast data rates. However, the data rate limits of the driver and receiver channels may prohibit the tester from achieving the desired data rates during testing of the DUT.

The data rate of a tester is typically limited by both the "minimum pulse width" and the "minimum refire time" of the timing signals produced by the driver and receiver channels. The minimum pulse width restriction applies both to timing signals with logical high values, and to timing signals with logical low values. Further, the minimum refire time refers to the amount of time a channel must wait before asserting a new timing signal.

FIG. 1A shows a block diagram of a typical timing generator used to produce timing signals in a tester. Global timing generator 100 produces a timing pulse that is asserted at the beginning of each tester cycle. This timing pulse, also known as the beginning of cycle (BOC) signal, is routed to each driver and receiver channel, such as CHANNEL 1, and CHANNEL 2 through CHANNEL N. Because a tester channel may generally be configured as either a driver or a receiver, the driver and receiver channels will be referred to simply as channels.

Each channel includes several copies of both local timing generator 102 and interpolator 104. This is because each channel is capable of producing multiple timing signals. Local timing generator 102 produces a timing signal that is delayed relative to the BOC signal by a programmable amount of time. Interpolator 104 also adds a programmable delay to the timing signal. Local timing generator 102 generally introduces a coarse delay, whereas interpolator 104 generally introduces a fine delay; i.e., the fine delay provided by interpolator 104 can be specified to a higher resolution than the coarse delay provided by local timing generator 102.

The timing signals produced by the interpolator circuits in each channel are applied to the formatter circuitry. For example, the interpolator circuits in CHANNEL 1 apply timing signals to formatter 106. Local timing generator 102 also applies format information and data values to formatter 106. Formatter 106 typically includes the drivers and comparators required to either apply a test signal to a node of the DUT, or detect an output signal produced by the DUT in response to a test signal. However, the data rates of CHANNEL 1, and CHANNEL 2 through CHANNEL N, are limited by both the minimum pulse width and the minimum refire time restrictions.

FIG. 1B shows a prior art circuit used to increase the data rate of a tester channel. Instead of being applied directly to the formatter circuitry, the timing signals produced by the interpolator circuits are first applied to OR gate 118, thereby producing signal OR 1B.

FIG. 1C is a timing diagram that is useful in describing the operation of the circuit depicted in FIG. 1B. For the typical mode of operation depicted in FIG. 1C, the minimum pulse width of the timing signals is equal to two cycles of signal CLOCK 1B, and the minimum refire time of the tester channel is equal to eight cycles of signal CLOCK 1B. Operating the circuit shown in FIG. 1B to produce timing signals at the fastest data rate possible, each of the timing signals on lines 110, 112, 114, and 116 is shown in FIG. 1C having a pulse width equal to two cycles, and a period equal to eight cycles.

FIG. 1C also shows signal OR 1B, which is a logical combination of the timing signals on lines 110, 112, 114, and 116 created by OR gate 118. Whereas a timing pulse appears on lines 110, 112, 114, and 116 every eight cycles, a timing pulse appears on signal OR 1B every two cycles. As a result, signal OR 1B has a data rate that is four times faster than that of the signals on lines 110, 112, 114, and 116.

However, there are two drawbacks to this approach of increasing the data rate of tester channels. First, the data transitions between timing pulses on signal OR 1B are determined by two edges. For example, the data transition between cycles two and three is determined by the falling and the rising edges of the signals on lines 110 and 112, respectively. Similarly, the data transition between cycles six and seven is determined by the falling and the rising edges of the signals on lines 114 and 116, respectively. As a result, either "glitches" or data dependent "jitter" may appear on signal OR 1B.

For example, a glitch may appear if the falling edge of the signal on line 110 occurs slightly before the rising edge of the signal on line 112. As shown in FIG. 1C, signal OR 1B begins to transition from high to low between cycles two and three of signal CLOCK 1B, thereby producing a glitch. A similar situation results between cycles four and five, cycles six and seven, and cycles eight and one of signal CLOCK 1B.

Further, data dependent jitter may appear if the rising or falling edge of one timing signal is delayed relative to another timing signal. As a result, the data transitions between timing pulses on signal OR 1B may occur slightly before or slightly after the proper times.

Second, this approach does not eliminate the minimum pulse width restriction on the timing signals. Although the data rate of signal OR 1B is four times that of the data rates of the signals on lines 110, 112, 114, and 116, the width of the timing signals on signal OR 1B cannot be made smaller than the minimum pulse width of two cycles.

FIG. 1D shows another prior art circuit used to increase the data rate of a tester channel. Whereas the circuit of FIG. 1B combined four timing signals using an OR gate, the circuit of FIG. 1D combines the signals on lines 120, 122, 124, and 126, produced by the interpolator circuits, by passing the signals through exclusive-or (XOR) gate 128. Signal XOR 1D is then re-clocked by register 130.

Both glitches and data dependent jitter are eliminated bypassing signal XOR 1D through register 130, thereby producing signal DATA 1D. This is because register 130 re-clocks signal XOR 1D at a time when signal XOR 1D has stabilized.

FIG. 1E is a timing diagram that is useful in describing the operation of the circuit depicted in FIG. 1D. Once again, the minimum pulse width of the timing signals on lines 120, 122, 124, and 126 is equal to two cycles of signal CLOCK 1D, and the minimum refire time of the channels is equal to eight cycles of signal CLOCK 1D. Further, signal XOR 1D depicts the combination of the signals on lines 120, 122, 124, and 126 created by XOR gate 128. Finally, register 130 re-clocks signal XOR 1D to produce signal DATA 1D. As shown in FIG. 1E, signal DATA 1D exhibits neither glitches nor data dependent jitter.

In contrast to signal OR 1B depicted in FIG. 1C, signals XOR 1D and DATA 1D are not restricted by the minimum pulse width of the timing signals on lines 120, 122, 124, and 126. This is because pulses with widths less than the minimum pulse width can be created by specifying the timing pulses created by both the local timing generators and the interpolators such that they overlap in time. For example, the signals on lines 120 and 122 overlap during cycle two of signal CLOCK 1D. As a result, signal XOR 1D has a pulse with logical value high and a pulse with logical value low during cycles one and two, respectively. The pulse widths of these timing signals are equal to one-half of the minimum pulse width of the signals on lines 120, 122, 124, and 126.

Additionally, if the signals on lines 122 and 124, and the signals on lines 124 and 126, are specified so that they overlap in the same manner as signals 120 and 122, then a series of pulses with widths equal to one cycle of signal CLOCK 1D would appear on signal XOR 1D. Whereas a timing pulse appears on lines 120, 122, 124, and 126 every eight cycles, a timing pulse would appear on signal XOR 1D every cycle. As a result, signal XOR 1D would have a data rate that is eight times faster than that of the signals on lines 120, 122, 124, and 126.

However, this approach also has some drawbacks. For example, consider the case where a serial data stream is applied to a node of the DUT. Referring to FIG. 1E, signal XOR 1D generates the four-bit word "1011" during cycles one through four, and also during cycles five through eight of signal CLOCK 1D. However, the characteristics of the signals on lines 120, 122, 124, and 126 during cycles one through four are different from the corresponding signal characteristics during cycles five through eight.

For example, in order to produce the four-bit word "1011" during cycles one through four, a pulse on line 120 is specified as high during cycles one and two. Similarly, a pulse on line 122 is specified as high during cycles two and three, and a pulse on line 126 is specified as high during cycles four and five. However, in order to produce the same four-bit word during cycles five through eight, a pulse on line 126 is specified as high during cycles four and five. Also, a pulse on line 124 is specified as high during cycles seven and eight. As a result, a different set of timing pulses are combined during each four-cycle time interval to create the same four-bit word. It follows that a four-bit word appearing on signal XOR 1D does not necessarily correspond to a unique combination of the timing signals on lines 120, 122, 124, and 126.

Additionally, the timing signal on line 126 is a pulse that overlaps cycles four and five of signal CLOCK 1D. Consequently, the pulse on line 126 is combined with the timing signals on lines 120, 122, and 124 to produce both the four-bit word asserted during cycles one through four, and the four-bit word asserted during cycles five through eight. This means that the generation of a four-bit serial data stream during a four-cycle time interval may be dependent upon the characteristics of the timing signals that occur during the cycle immediately prior to the four-cycle time interval. These drawbacks severely limit the programming flexibility of a tester.

Although each of these techniques have been used to increase the data rate of timing signals produced by the driver and receiver channels of a tester, it would be desirable to have a method of increasing the data rate of timing signals that is not restricted by either the minimum pulse width of the timing signals or the minimum refire time of the driver and receiver channel circuitry. It would also be desirable to increase the data rate of timing signals without adversely affecting programming flexibility.

SUMMARY OF THE INVENTION

With the foregoing background in mind, it is an object of the invention to provide a tester that can both apply and detect timing signals to and from a node of an electronic device at faster data rates.

Another object of the invention is to provide a tester that supports test programs that are flexible and easy to maintain.

The foregoing and other objects are achieved by generating digital timing signals using a plurality of groups of timing generators. The digital timing signals produced by each group of timing generators are combined bypassing them through combinatorial logic which performs the "exclusive-or" (XOR) operation. The signals produced by each XOR gate are then combined by applying them to combinatorial logic which performs the "or" (OR) operation.

According to one feature, the digital timing signals produced by each group of timing generators are encoded such that each timing generator optionally asserts a timing pulse only during specified cycles within a series of clock cycles. The outputs of the timing generators in each group are then applied to an XOR gate to produce a serial data stream. Each combination of timing generator outputs either asserting their respective encoded timing signals, or not asserting any timing signals during the series of clock cycles, causes the XOR gate to produce a unique serial data stream. The outputs of each XOR gate are then applied to an OR gate, thereby combining the serial data streams produced by each XOR gate to generate a single serial data stream.

In one embodiment, only one group of timing generators produces timing signals at a time. Accordingly, a first group of timing generators produces encoded timing signals during a series of clock cycles. When the first group has finished, a second group produces encoded timing signals during a series of clock cycles immediately following the first group. The process continues until each group has produced encoded timing signals, at which time the process optionally repeats.

In another embodiment, a plurality of groups of timing generators produce timing signals simultaneously. Accordingly, a first group of timing generators produces encoded timing signals during a series of clock cycles. The encoded timing signals produced by the first group are specified such that at least one of the data bits in the serial data stream generated from the first group's timing signals is zero. While the first group is producing the encoded timing signals to generate the at least one zero in the serial data stream, a second group produces encoded timing signals. The encoded timing signals produced by the second group are optionally specified such that at least one of the data bits in the serial data stream generated from the second group's timing signals is zero. The process continues until each group has produced encoded timing signals, at which time the process optionally repeats.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1A is a block diagram of the timing generator and channels of a prior art tester, FIG. 1B is a block diagram of the channel of a prior art tester, used to increase the data rate of timing signals, FIG. 1C is a timing diagram describing the generation of timing signals using the FIG. 1B apparatus, FIG. 1D is a block diagram of another channel of a prior art tester, used to increase the data rate of timing signals, FIG. 1E is a timing diagram describing the generation of timing signals using the FIG. 1D apparatus.

DESCRIPTION OF THE PREFERRED EMBODIMENT

Figure 2A:
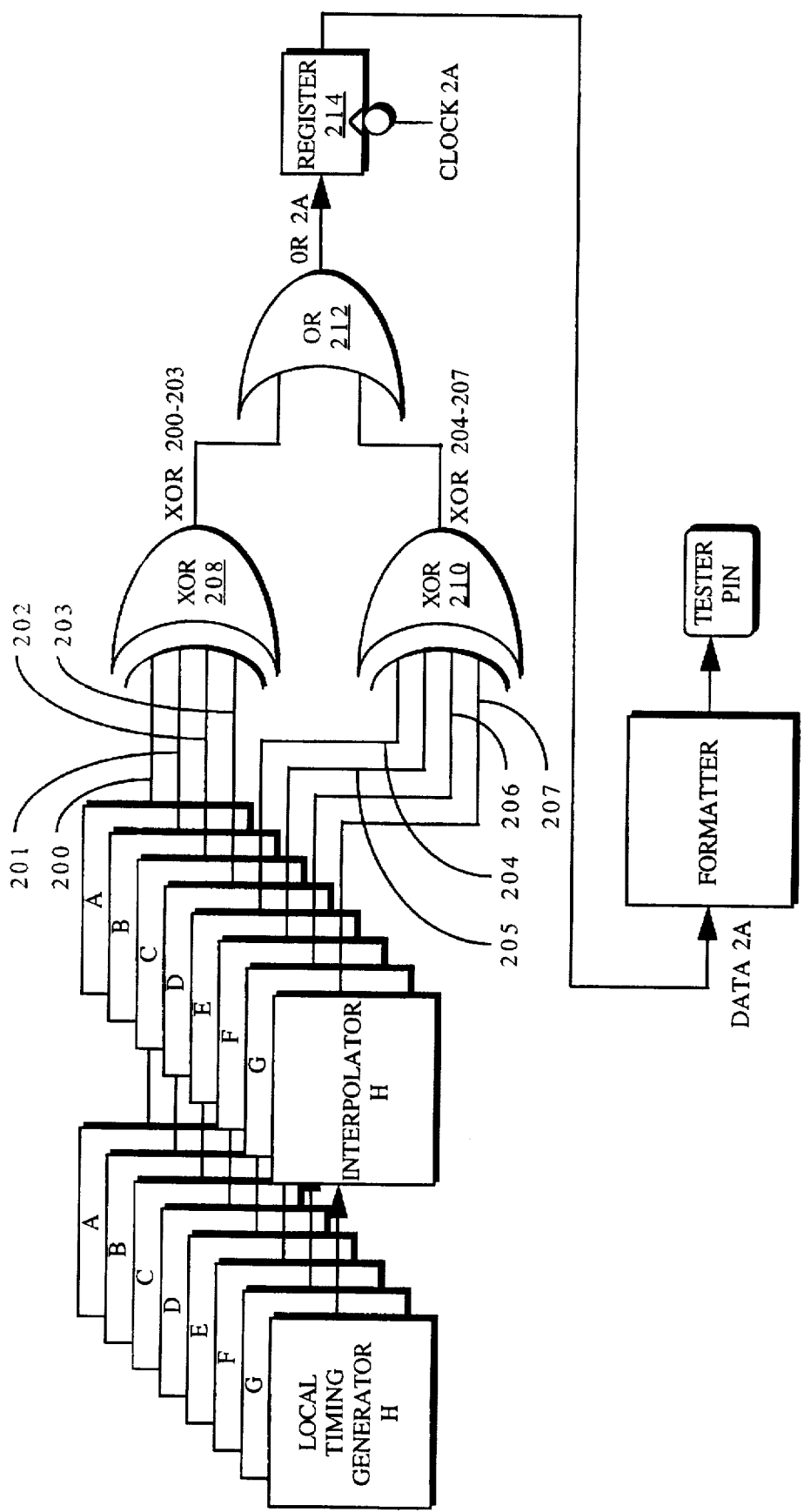
FIG. 2A is a block diagram of a channel which increases the data rate of timing signals using the method of the present invention.

FIG. 2A shows a block diagram of a channel which increases the data rate of timing signals in accordance with the method of present invention. The channel includes several copies of both the local timing generator circuitry and the interpolator circuitry. This is because the channel is capable of generating multiple timing signals. Each local timing generator generally adds a coarse delay to a timing signal. Each interpolator also generally adds a delay to a timing signal. However, the fine delay provided by each interpolator can be specified to a higher resolution than the coarse delay provided by each local timing generator.

The timing signals produced by the interpolator circuits are applied to combinatorial logic. In the preferred embodiment, the signals on lines 200, 201, 202, and 203 are applied to XOR gate 208, and the signals on lines 204, 205, 206, and 207 are applied to XOR gate 210. Both XOR gate 208 and XOR gate 210 combine the timing signals at their inputs using the "exclusive-or" operation. The operation of a typical XOR gate is well known.

Next, signals XOR 200-203 and XOR 204-207 are combined by OR gate 212, thereby producing signal OR 2A. The operation of a typical OR gate is also well known. Finally, register 214 re-clocks signal OR 2A to produce signal DATA 2A. Register 214 eliminates both glitches and data dependent jitter in the same manner as the prior art circuit shown in FIG. 1D.

Figure 2B:
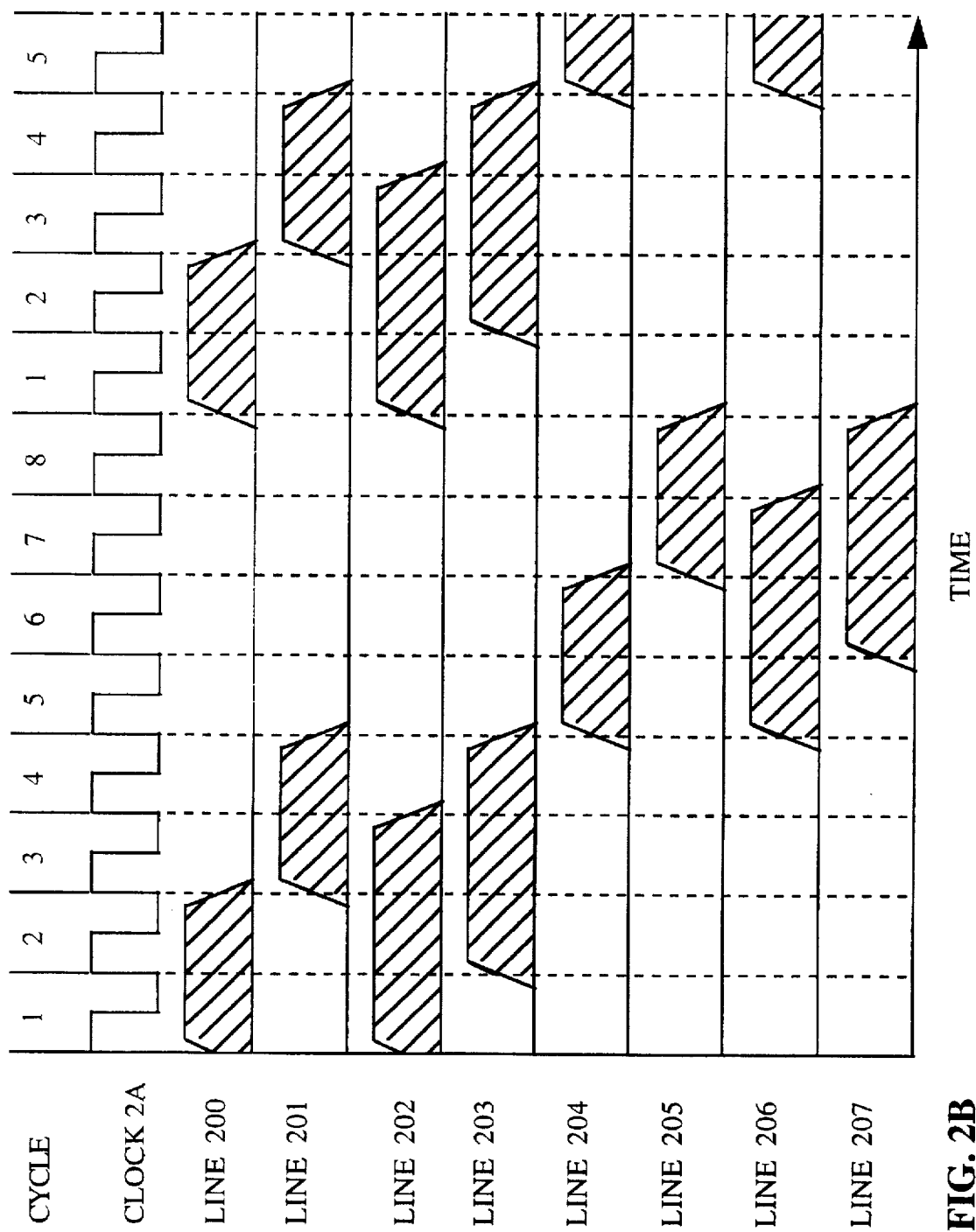
FIG. 2B is a timing diagram describing one manner of encoding the timing signals to implement the method of the present invention.

An important feature of the present invention is the encoding of the timing signals on lines 200, 201, 202, 203, 204, 205, 206, and 207. FIG. 2B is a timing diagram that is useful in describing the preferred method of encoding the timing signals. For a typical mode of operation, the minimum pulse width of the timing signals is equal to two cycles of CLOCK 2A, and the minimum refire time of the tester channel is equal to eight cycles of signal CLOCK 2A.

The local timing generator and interpolator circuits shown in FIG. 2A produce timing signals on lines 200, 201, 202, 203, 204, 205, 206, and 207 during the first eight cycles of signal CLOCK 2A. The timing signals are encoded according to the method shown in FIG. 2B. Further, the method of encoding the timing signals is repeated for subsequent cycles of signal CLOCK 2A.

During the first eight cycles of signal CLOCK 2A, and for each consecutive series of eight cycles thereafter, the timing signals are encoded using the preferred method as follows: the signal on line 200 may be logical high only during cycles one and two; the signal on line 201 may be logical high only during cycles three and four; the signal on line 202 may be logical high only during cycles one, two, and three; the signal on line 203 may be logical high only during cycles two, three, and four; the signal on line 204 may be logical high only during cycles five and six; the signal on line 205 may be logical high only during cycles seven and eight; the signal on line 206 may be logical high only during cycles five, six, and seven; and the signal on line 207 may be logical high only during cycles six, seven, and eight.

The method of encoding the timing signals produced by the local timing generator and interpolator circuits has several important features. First, the timing signals cannot be either logical high or logical low for less than two cycles of signal CLOCK 2A. This is because for the typical mode of operation depicted, the minimum pulse width of the timing signals produced by the driver/receiver channels is two cycles of signal CLOCK 2A.

Second, while lines 200, 201, 202, and 203 carry timing signals during cycles one through four of signal CLOCK 2A, lines 204, 205, 206, and 207 remain logical low. Similarly, while lines 204, 205, 206, and 207 carry timing signals during cycles five through eight of signal CLOCK 2A, lines 200, 201, 202, and 203 remain logical low. This eliminates one of the drawbacks of the prior art circuit shown in FIG. 1D.

For example, referring once again to the timing diagram shown in FIG. 1E, the timing signal on line 126 is shown as a pulse that overlaps cycles four and five of signal CLOCK 1D. Because the serial data stream is produced by combining the signals on lines 120, 122, 124, and 126, both the four-bit word produced during cycles one through four, and the four-bit word produced during cycles five through eight depend upon the signal on line 126. As a result, the four-bit word produced during cycles five through eight is dependent upon a timing signal that was produced during cycle four of signal CLOCK 1D. This means that the values of successive four-bit data words must be known in advance. This limits the test engineer's ability to use "branching" and "looping" in test programs to create a data stream from a series of four-bit data words.

In contrast, the method of encoding the timing signals shown in FIG. 2B allows the use of branching and looping in test programs to create a data stream from a series of four-bit words. The timing signals on lines 200, 201, 202, and 203, asserted during cycles one through four, are not allowed to overlap cycles five, six, seven, or eight. Similarly, the timing signals on lines 204, 205, 206, and 207, asserted during cycles five through eight, are not allowed to overlap cycles one, two, three, or four. As a result, a four-bit serial data stream produced during either cycles one through four or cycles five through eight is not dependent upon any timing signal produced during a previous cycle of CLOCK 2A, and the values of successive four-bit data words need not be known in advance. The signals on lines 200, 201, 202, and 203, and the signals on lines 204, 205, 206, and 207 are further isolated from one another by applying them to separate XOR gates, namely XOR gate 208 and XOR gate 210.

Third, each logical combination of channels either asserting a timing signal or remaining idle during a series of four clock cycles produces a unique four-bit serial data stream.

Figure 2C:
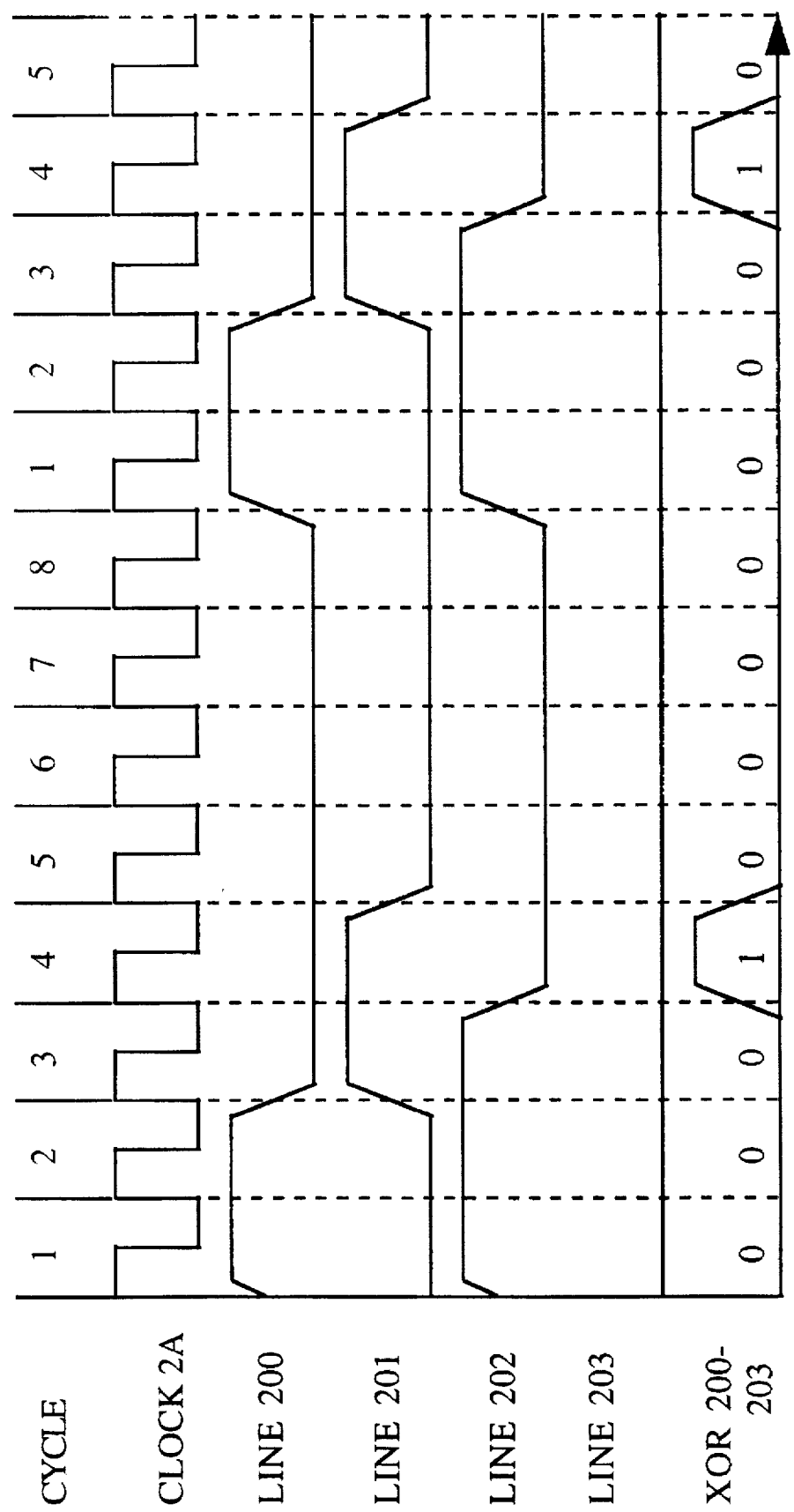
FIG. 2C is a timing diagram describing the generation of timing signals with a fast data rate using the FIG. 2A apparatus.

For example, consider the case where timing signals are asserted on lines 200, 201, 202, 204, 205, and 206, and lines 203 and 207 are allowed to remain idle. Turning to FIG. 2C, the timing signals on lines 200, 201, and 202 are shown encoded using the preferred method described above, and no timing signal appears on line 203. The signals on lines 200, 201, and 202 are combined with line 203 by passing them through XOR gate 208, thereby producing signal XOR 200–203. As a result, the four-bit word "0001" is produced during cycles one through four.

Figure 2D:
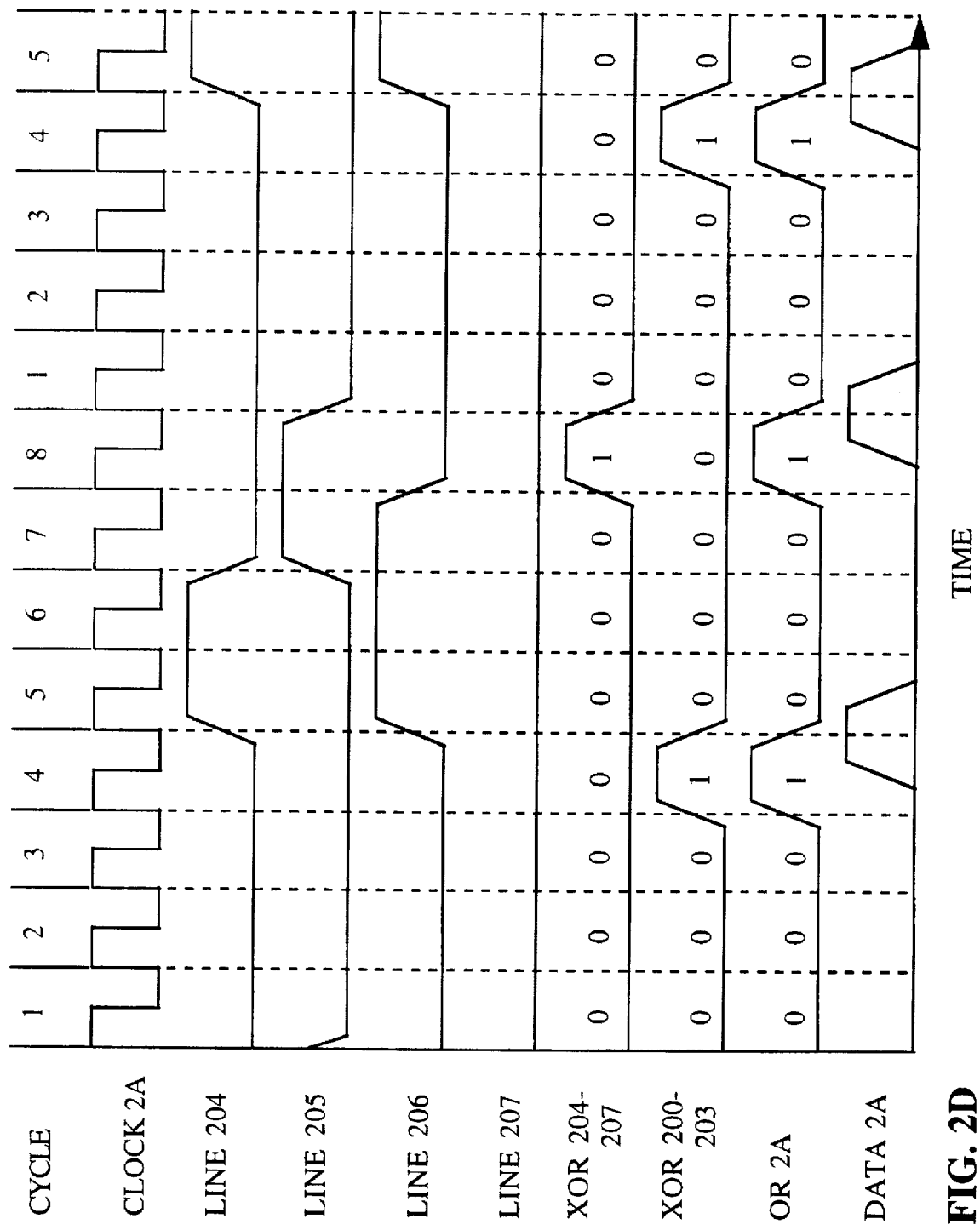
FIG. 2D is another timing diagram describing the generation of timing signals with a fast data rate using the FIG. 2A apparatus.

Turning to FIG. 2D, the timing signals on lines 204, 205, and 206 are also shown encoded using the preferred method described above, and line 207 is shown without a timing signal. The signals on lines 204, 205, and 206 are combined with line 207 bypassing them through XOR gate 210, thereby producing signal XOR 204–207. As a result, the four-bit word "0001" is produced during cycles five through eight. The timing signals on lines 200, 201, 202, 203, 204, 205, 206, and 207 are encoded so that each combination of timing signals produces a unique four-bit word. Because the timing signals are encoded in groups of four, sixteen unique four-bit words may be produced using the preferred method. If each local timing generator/interpolator pair shown in FIG. 2A is referred to simply as a timing generator, then TABLE I indicates which timing generators should assert a timing signal, and which timing generators should remain idle, in order to produce the sixteen four-bit words.

TABLE I

| TIMING GENERATOR | | | | RESULTING FOUR-BIT WORD | | | |
|---|---|---|---|---|---|---|---|
| A,E | B,F | C,G | D,H | | | | |
| N | N | N | N | 0 | 0 | 0 | 0 |
| Y | N | N | N | 0 | 0 | 0 | 1 |
| Y | N | Y | N | 0 | 0 | 1 | 0 |
| N | Y | N | N | 0 | 0 | 1 | 1 |
| N | Y | N | Y | 0 | 1 | 0 | 0 |
| Y | N | Y | Y | 0 | 1 | 0 | 1 |
| Y | Y | Y | Y | 0 | 1 | 1 | 0 |
| N | N | N | Y | 0 | 1 | 1 | 1 |
| Y | Y | N | Y | 1 | 0 | 0 | 0 |
| N | N | Y | Y | 1 | 0 | 0 | 1 |
| N | Y | Y | Y | 1 | 0 | 1 | 0 |
| Y | N | N | Y | 1 | 0 | 1 | 1 |
| Y | N | N | N | 1 | 1 | 0 | 0 |
| N | Y | Y | N | 1 | 1 | 0 | 1 |
| N | N | Y | N | 1 | 1 | 1 | 0 |
| Y | Y | N | N | 1 | 1 | 1 | 1 |

TABLE I-continued

In TABLE I, timing generators A, B, C, and D produce the timing signals on lines 200, 201, 202, and 203, respectively. Similarly, timing generators E, F, G, and H produce the timing signals on lines 204, 205, 206, and 207, respectively.

Further, in TABLE I, a "Y" indicates that a timing generator should assert its corresponding encoded timing signal, and an "N" indicates that a timing generator should remain idle.

Additionally, in the preferred method, timing generators A, B, C, and D, and timing generators E, F, G, and H follow the same encoding scheme. For this reason, TABLE I shows that a specific combination of timing generators either asserting a timing signal or remaining idle will produce the same four-bit word for both timing generators A, B, C, and D, and timing generators E, F, G, and H. For example, if timing generators A, B, C, D, E, F, G, and H all assert their corresponding encoded timing signals, then the four-bit data word "0110" will be produced during both cycles one through four, and cycles five through eight.

Signal OR 2A, shown in FIG. 2D, is the combination of signals XOR 200–203 and XOR 204–207. Further, register 214 re-clocks signal OR 2A to produce signal DATA 2A, thereby removing any glitches or data dependent jitter.

Although the timing signals produced by timing generators A, B, C, D, E, F, G, and H cannot be either logical high or logical low for less than two cycles of signal CLOCK 2A, due to the minimum pulse width limitation, signals XOR 200–203, XOR 204–207, OR 2A, and DATA 2A may be either logical high or logical low for one cycle of signal CLOCK 2A. This is because pulses with widths less than the minimum pulse width can be created by specifying the timing pulses produced by the timing generators such that they overlap in time.

For example, FIG. 2C shows that the signals on lines 201 and 202 overlap during cycle three of signal CLOCK 2A. As a result, signal XOR 200–203 has a pulse with logical value high during cycle four. Similarly, FIG. 2D shows that the signals on lines 205 and 206 overlap during cycle seven of signal CLOCK 2A. As a result, signal XOR 204–207 has a pulse with logical value high during cycle eight. The pulse widths of these timing signals are equal to one-half of the pulse width of the signals on lines 200, 201, 204, and 205.

Additionally, if timing signals, encoded using the preferred method, are asserted on lines 201, 202, 203, 205, 206, and 207, and lines 200 and 204 carry no timing signals, then the four-bit word "1010" would be produced during cycles one through four, and during cycles five through eight. For this case, it is readily seen that the channel shown in FIG. 2A can be programmed so that signal OR 2A carries a new bit of information every cycle of signal CLOCK 2A. In contrast, the signals on lines 200, 201, 202, 203, 204, 205, 206, and 207 are capable of carrying a new bit of information every eight cycles. As a result, signal OR 2A has a data rate that is eight times faster than that of the signals on lines 200, 201, 202, 203, 204, 205, 206, and 207.

If the minimum refire time for the typical mode of operation were five cycles of signal CLOCK 2A, instead of eight cycles of signal CLOCK 2A, then the preferred method of encoding the timing signals could also be used to produce timing signals with data rates that are either five, six, or seven times faster than that of the signals on lines 200, 201, 202, 203, 204, 205, 206, and 207.

Figure 2E:
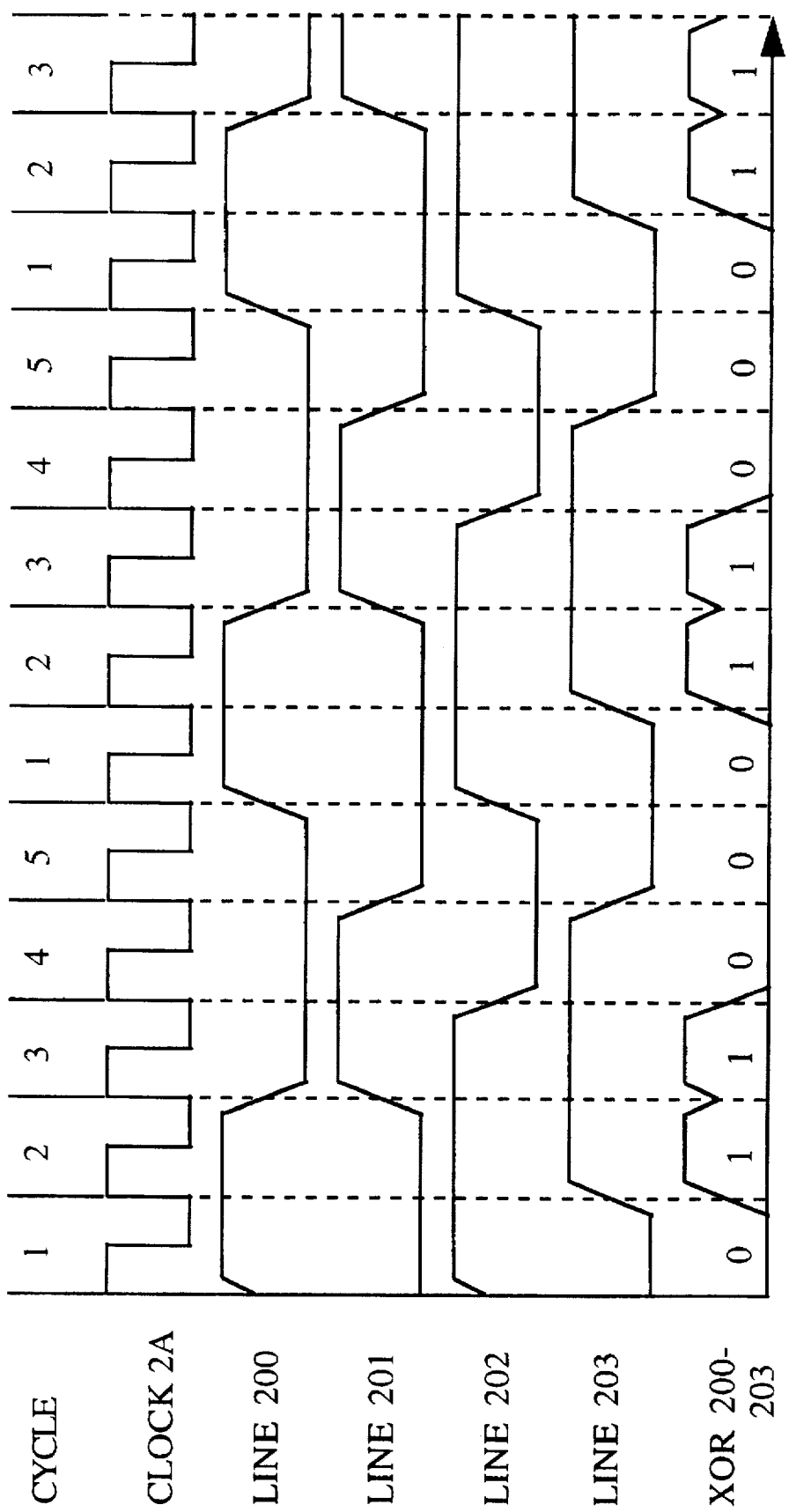
FIG. 2E is a timing diagram describing the generation of timing signals with a data rate that is different from that shown in FIG. 2C and FIG. 2D.

Turning to FIG. 2E, the timing signals on lines 200, 201, 202, and 203 are shown encoded, using the preferred method described above, during cycles one through four. However, instead of repeating every eight cycles, FIG. 2E shows the encoding scheme repeating every five cycles of signal CLOCK 2A. For the mode of operation shown in FIG. 2E, the minimum pulse width of the timing signals is equal to two cycles of CLOCK 2A, and the minimum refire time of the tester channel is equal to five cycles of signal CLOCK 2A.

Note that the minimum pulse width limitation is upheld such that no timing signal on lines 200, 201, 202, and 203 is either logical high or logical low for less than two cycles of signal CLOCK 2A. Similarly, the minimum refire time limitation is upheld such that the rising edges of each of the timing pulses occurring on lines 200, 201, 202, and 203 are separated by five cycles of signal CLOCK 2A. XOR gate 208 combines the signals on lines 200, 201, 202, and 203 to produce signal XOR 200-203, which consists of a four-bit word during cycles one through four, plus a logical low value during cycle five.

Figure 2F:
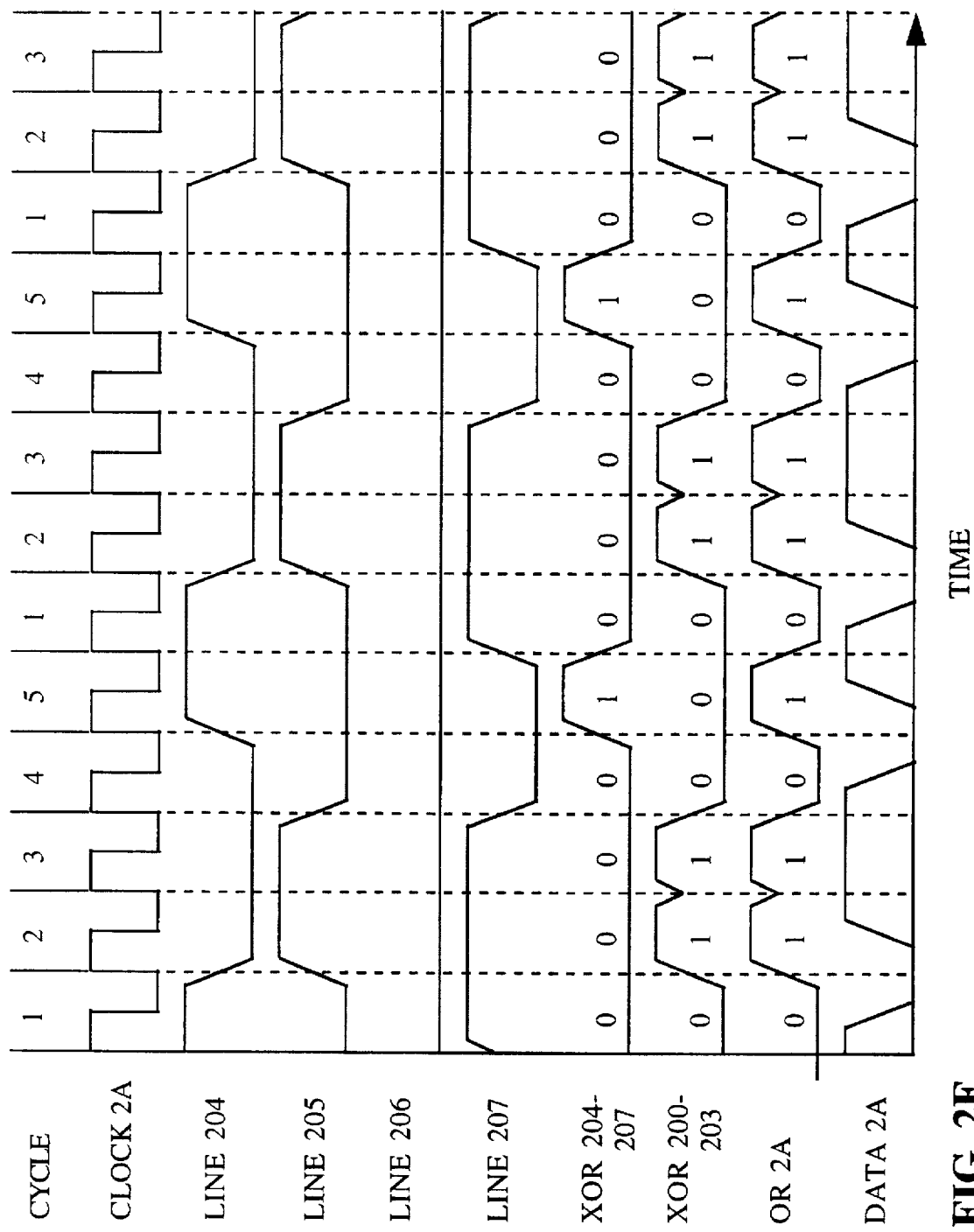
FIG. 2F is another timing diagram describing the generation of timing signals with a data rate that is different from that shown in FIG. 2C and FIG. 2D.

Turning now to FIG. 2F, the timing signals on lines 204, 205, and 207 are shown encoded using the preferred method described above, and line 206 is shown without a timing signal. Once again, the minimum pulse width is equal to two cycles, and the minimum refire time is equal to five cycles of signal CLOCK 2A.

The signals on lines 204, 205, and 207 are combined with line 206 bypassing them through XOR gate 210, thereby producing signal XOR 204-207. As a result, the four-bit word "1000" is produced during cycles five, one, two, and three of signal CLOCK 2A.

It was shown in FIG. 2B that the timing signals on lines 200, 201, 202, and 203, asserted during cycles one through four, were not allowed to overlap cycles five, six, seven, or eight. Similarly, the timing signals on lines 204, 205, 206, and 207, asserted during cycles five through eight, were no allowed to overlap cycles one, two, three, or four. As a result, a four-bit serial data stream produced during either cycles one through four or cycles five through eight was not dependent upon any timing signal produced during a previous cycle of CLOCK 2A, and it was not necessary to know the values of successive four-bit data words in advance.

However, FIG. 2E and FIG. 2F show the timing signals on lines 200, 201, 202, and 203, and the timing signals on lines 204, 205, 206, and 207 overlapping during cycles one, two, and three of signal CLOCK 2A. Nevertheless, a four-bit serial data stream produced during cycles one through four, by combining the signals on lines 200, 201, 202, and 203, is not dependent upon the timing signals produced on lines 204, 205, 206, and 207. This is because the signals on lines 204, 205, 206, and 207 are combined to produce only the four-bit words, "0000" and "1000", during cycles five, one, two, and three. Consequently, the signals on lines 200, 201, 202, and 203 are combined by XOR gate 208 to produce a four-bit word during cycles one through four, and the signals on lines 204, 205, 206, and 207 are combined by XOR gate 210 to produce the desired logical value for cycle five, only. The three bits, "000", occurring on signal XOR 204-207 during cycles one, two, and three, do not affect the resulting serial data stream.

OR gate 212 combines signals XOR 200-203 and XOR 204-207 to produce signal OR 2A, which consists of the serial data stream "01101" during cycles one through five of signal CLOCK 2A. As a result, signal OR 2A has a data rate that is five times faster than that of the signals on lines 200, 201, 202, 203, 204, 205, 206, and 207.

Note that if no timing signals were asserted on lines 204, 205, 206, and 207, then signal OR 2A would consist of the serial data stream "01100" during cycles one through five. This is because the signals on lines 204, 205, 206, and 207 would be combined to produce the four-bit word "0000" during cycles five, one, two, and three.

If the minimum refire time for the typical mode of operation were five cycles of signal CLOCK 2A, then the preferred method of encoding the timing signals could also be used to produce timing signals with a data rate that is six times faster than that of the encoded timing signals by first encoding the timing signals on lines 200, 201, 202, and 203, using the preferred method, during cycles one through four, and then repeating the encoding scheme every six cycles of signal CLOCK 2A. Once again, the minimum pulse width of the timing signals is equal to two cycles of CLOCK 2A.

Next, the timing signals on lines 204, 205, 206, and 207 are encoded using the preferred method, and are asserted during cycles five, six, one, and two. However, the signals on lines 204, 205, 206, and 207 would be combined to produce only the following four-bit words: "0000", "0100", "1000", and "1100". This is because the signals on lines 204, 205, 206, and 207 are combined by XOR gate 210 to produce the desired logical values for cycles five and six, only. The two bits, "00", occurring on signal XOR 204-207 during cycles one and two, do not affect the resulting serial data stream.

Finally, if the minimum refire time for the typical mode of operation were five cycles of signal CLOCK 2A, then the preferred method of encoding the timing signals could also be used to produce timing signals with a data rate that is seven times faster than that of the encoded timing signals by first encoding the timing signals on lines 200, 201, 202, and 203, using the preferred method, during cycles one through four, and then repeating the encoding scheme every seven cycles of signal CLOCK 2A. Once again, the minimum pulse width of the timing signals is equal to two cycles of CLOCK 2A.

Next, the timing signals on lines 204, 205, 206, and 207 are encoded using the preferred method, and are asserted during cycles five, six, seven, and one. However, the signals on lines 204, 205, 206, and 207 would be combined to produce only the following four-bit words: "0000", "0010", "0100", "0110", "1000", "1010", "1100", and "1110". This is because the signals on lines 204, 205, 206, and 207 are combined by XOR gate 210 to produce the desired logical values for cycles five, six, and seven, only. The bit, "0", occurring on signal XOR 204-207 during cycle one, does not affect the resulting serial data stream.

Having described one embodiment, numerous alternative embodiments or variations might be made. For example, it was described that two groups of timing signals are combined by two XOR gates. However, this implementation is merely an illustration. Any number of groups may be used. When the number of groups of timing signals is changed, the number of XOR gates combining the timing signals should be changed accordingly.

Also, the number of timing signals in each group serves as an illustration. Any number of timing signals may be used in each group, depending upon the number of timing generators available, and the desired length of the serial data stream produced by each group. When the number of timing signals in each group is changed, the number of inputs of each XOR gate should be changed accordingly.

Also, it was described that the timing signal produced by each timing generator is encoded so that it is asserted only during certain consecutive cycles within a series of clock cycles. However, this implementation is also merely an illustration. The timing signals produced by each group of timing generators may be encoded using any method which results in the timing signals having no dependency upon the timing signals generated by another group, and which results in each combination of timing signals producing a unique serial data stream.

Also, it was described that the method of encoding the timing signals may by used to produce timing signals with data rates that are from five to eight times faster than the channel rates. However, this method is merely an illustration. Alternative encoding methods may be used to produce timing signals with any desired data rate.

Also, it should be appreciated that the prior art tester architectures shown in FIG. 1A, FIG. 1B, FIG. 1D, and FIG. 2A are merely illustrations. The invention might be used to increase the data rate of timing signals in a tester of any architecture. The invention might also be used in other applications where an increased serial data rate is required.

Therefore, the invention should be limited only by the spirit and scope of the appended claims.

What is claimed is:

1. A method of operating a tester to increase the data rate of digital timing signals produced by the tester, comprising:
   (a) generating a plurality of groups of digital timing signals, each group of digital timing signals being generated during a different one of a plurality of non-overlapping time intervals;
   (b) combining each group of digital timing signals generated in step (a) to produce a plurality of serial data streams, wherein each group of digital timing signals is combined in accordance with the Boolean logical "exclusive-or" operation; and
   (c) combining the plurality of serial data streams produced in step (b) to produce a new digital timing signal, wherein the serial data streams are combined in accordance with the Boolean logical "or" operation, whereby the data rate of the new digital timing signal is faster than the data rate of each digital timing signal generated in step (a).

2. The method of claim 1,
wherein a plurality of clock cycles occurs during each non-overlapping time interval, and
wherein each digital timing signal generated in step (a) can be asserted only during specified clock cycles.

3. The method of claim 2,
wherein the same number of clock cycles occur during each time interval.

4. The method of claim 2,
wherein each digital timing signal is asserted for at least a minimum pulse width.

5. The method of claim 1,
wherein said generating in step (a) comprises
   (a1) generating a first group of four digital timing signals during a first time interval, and
   (a2) generating a second group of four digital timing signals during a second time interval.

6. The method of claim 5,
wherein four cycles of a clock occur during both the first time interval and the second time interval,
wherein said generating in step (a1) includes
   (i) optionally generating a first timing signal, said first timing signal comprising a pulse asserted during cycles one and two of the clock,
   (ii) optionally generating a second timing signal, said second timing signal comprising a pulse asserted during cycles three and four of the clock,
   (iii) optionally generating a third timing signal, said third timing signal comprising a pulse asserted during cycles one, two and three of the clock, and
   (iv) optionally generating a fourth timing signal, said fourth timing signal comprising a pulse asserted during cycles two, three, and four of the clock, and
wherein said generating in step (a2) includes
   (i) optionally generating a fifth timing signal, said fifth timing signal comprising a pulse asserted during cycles five and six of the clock,
   (ii) optionally generating a sixth timing signal, said sixth timing signal comprising a pulse asserted during cycles seven and eight of the clock,
   (iii) optionally generating a seventh timing signal, said seventh timing signal comprising a pulse asserted during cycles five, six, and seven of the clock, and
   (iv) optionally generating an eighth timing signal, said eighth timing signal comprising a pulse asserted during cycles six, seven, and eight of the clock.

7. The method of claim 6,
wherein each timing signal has a minimum pulse width equal to two cycles of the clock, and
wherein each timing signal has a minimum refire time equal to eight cycles of the clock.

8. The method of claim 1,
wherein each time interval is periodic.

9. The method of claim 8,
wherein each time interval has a period equal to a minimum refire time.

10. The method of claim 1,
wherein each serial data stream produced in step (b) corresponds to a different combination of digital timing signals.

11. A tester, adapted to produce a digital timing signal having a fast data rate, comprising:
   (a) means for generating a plurality of groups of digital timing signals, wherein each group of digital timing signals is generated during a different one of a plurality of non-overlapping time intervals; and
   (b) combinatorial logic, coupled to the means for generating digital timing signals, comprising
      (i) a plurality of "exclusive-or" gates, each group of digital timing signals being applied to one of said plurality of "exclusive-or" gates, thereby producing a plurality of serial data streams, and
      (ii) an "or" gate, coupled to each "exclusive-or" gate, thereby combining the serial data streams to produce a new digital timing signal having a fast data rate.

12. The tester of claim 11,
wherein a plurality of clock cycles occurs during each non-overlapping time interval, and
wherein each digital timing signal can be asserted only during specified clock cycles.

13. The tester of claim 11,
wherein each serial data stream corresponds to a different combination of digital timing signals applied to one of the plurality of "exclusive-or" gates.

* * * * *